US009070449B2

(12) United States Patent
Yang et al.

(10) Patent No.: US 9,070,449 B2
(45) Date of Patent: Jun. 30, 2015

(54) DEFECTIVE BLOCK MANAGEMENT

(71) Applicant: SanDisk Technologies, Inc., Plano, TX (US)

(72) Inventors: Nian Niles Yang, Mountain View, CA (US); Uday Chandrasekhar, San Jose, CA (US); Yichao Huang, San Jose, CA (US); Alexandra Bauche, San Jose, CA (US); William S. Wu, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 151 days.

(21) Appl. No.: 13/871,528

(22) Filed: Apr. 26, 2013

(65) Prior Publication Data
US 2014/0321202 A1 Oct. 30, 2014

(51) Int. Cl.
*G11C 16/04* (2006.01)
*G11C 16/06* (2006.01)
*G11C 8/14* (2006.01)
*G11C 16/34* (2006.01)
*G11C 29/02* (2006.01)
*G11C 29/00* (2006.01)
G11C 29/12 (2006.01)

(52) U.S. Cl.
CPC *G11C 16/06* (2013.01); *G11C 8/14* (2013.01); *G11C 16/0483* (2013.01); *G11C 16/3495* (2013.01); *G11C 29/025* (2013.01); *G11C 29/804* (2013.01); *G11C 29/82* (2013.01); G11C 2029/1202 (2013.01)

(58) Field of Classification Search
CPC ..... G11C 11/5628; G11C 29/82; G11C 16/10
USPC .......................... 365/185.03, 185.09, 185.18
See application file for complete search history.

(56) References Cited

U.S. PATENT DOCUMENTS

| 5,070,032 | A | | 12/1991 | Yuan et al. |
| 5,095,344 | A | | 3/1992 | Harari |
| 5,313,421 | A | | 5/1994 | Guterman et al. |
| 5,315,541 | A | | 5/1994 | Harari et al. |
| 5,343,063 | A | | 8/1994 | Yuan et al. |
| 5,570,315 | A | | 10/1996 | Tanaka et al. |
| 5,661,053 | A | | 8/1997 | Yuan |
| 5,768,192 | A | | 6/1998 | Eitan |
| 5,898,637 | A | * | 4/1999 | Lakhani et al. .......... 365/230.06 |
| 5,903,495 | A | | 5/1999 | Takeuchi et al. |

(Continued)

FOREIGN PATENT DOCUMENTS

WO    WO 2009/050703      4/2009

OTHER PUBLICATIONS

Notification of Transmittal of the International Search Report and the Written Opinion of the International Searching Authority, or the Declaration for Int'l Application No. PCT/US2014/033861 mailed Oct. 20, 2014, 12 pages.

(Continued)

*Primary Examiner* — Huan Hoang
(74) *Attorney, Agent, or Firm* — Davis Wright Tremaine LLP

(57) ABSTRACT

In a flash memory, erase blocks containing shorted or broken word lines may be used, at least in part, to store user data. Such blocks may use different parameters to those used by non-defective blocks, may be subject to different wear leveling, and may store data selected to reduce the number of access operations.

24 Claims, 9 Drawing Sheets

(56) References Cited

U.S. PATENT DOCUMENTS

| | | |
|---|---|---|
| 6,011,725 A | 1/2000 | Eitan |
| 6,046,935 A | 4/2000 | Takeuchi et al. |
| 6,222,762 B1 | 4/2001 | Guterman et al. |
| 2010/0271891 A1 | 10/2010 | Dell et al. |
| 2012/0008405 A1 | 1/2012 | Shah et al. |
| 2012/0275228 A1 | 11/2012 | Lu |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

| WL | Non-defective Block | | Defective Block | |
|---|---|---|---|---|
| 0 | 0 | 2 | 0 | 2 |
| 1 | 1 | 4 | 1 | 4 |
| 2 | 3 | 6 | 3 | 6 |
| 3 | 5 | 8 | 5 | 8 |
| 4 | 7 | 10 | 7 | 10 |
| 5 | 9 | 12 | 9 | 12 |
| 6 | 11 | 14 | 11 | 14 |
| 7 | 13 | 16 | 13 | 16 |
| 8 | 15 | 18 | 15 | 18 |
| 9 | 17 | 20 | dummy | dummy |
| 10 (Bad WL) | 19 | 22 | x | x |
| 11 (Bad WL) | 21 | 24 | x | x |
| 12 | 23 | 26 | dummy | dummy |
| 13 | 25 | 28 | 17 | 20 |
| 14 | 27 | 30 | 19 | 22 |
| 15 | 29 | 32 | 21 | 24 |
| 16 | 31 | 34 | 23 | 26 |
| 17 | 33 | 36 | 25 | 28 |
| 18 | 35 | 38 | 27 | 30 |
| 19 | 37 | 40 | 29 | 32 |
| 20 | 39 | 42 | 31 | 34 |

*FIG. 7*

DEFECTIVE BLOCK MANAGEMENT

BACKGROUND

This application relates to the operation of re-programmable non-volatile memory systems such as semiconductor flash memory, and more specifically, to systems and methods for handling certain kinds of defective blocks when they occur in such memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Some portions of a memory array may be defective, for example, individual cells, or groups of cells may be defective. In some cases a word line may be defective so that the word line cannot be biased normally. This generally prevents control of transistors along the word line and may result in the block containing the defective word line being discarded.

SUMMARY OF THE INVENTION

In a nonvolatile memory, a block that contains one or more defective word lines may be operated using modified conditions so that at least some of the capacity of the block can be used. A block containing word lines that are shorted together may apply the same voltages to all shorted word lines and avoid storing data along shorted word lines (and along neighboring word lines). Higher pass voltages may be applied to the shorted word lines. Memory cells along a broken word line may be controlled by applying high voltages to neighboring word lines. Cells along the broken word line, and the neighboring word lines used to control them (and additional neighboring word lines), are not used for data storage. Wear leveling may use amplified hot counts for defective blocks so that they receive less wear (fewer write-erase cycles). Data may be selected for storage in defective blocks so that the number of access operations is low.

An example of a method of operating a block erasable non-volatile memory array that has one or more defective erase blocks includes: identifying two or more word lines that are shorted together in a defective erase block; recording location information regarding the location of the defective erase block and the location of the shorted word lines within the defective erase block; and subsequently, programming data along word lines of the defective erase block that are not the shorted word lines.

The shorted word lines may receive a pass voltage during the programming that is higher than a pass voltage applied to unselected word lines that are not shorted. At least one word line on either side of the shorted word lines may be maintained as a dummy word line that does not store host data. The dummy word line may be programmed with dummy data. The dummy data may be programmed without verification. The data may be selected for storage in the defective erase block because it is cold data that is not frequently modified or accessed. The data may be selected for storage in the defective erase block because it is received as a stream of sequential data that is programmed at the same period of time. The electrical resistance between shorted word lines may be small enough that a voltage applied to a first shorted word line affects a voltage on a second shorted word line. The write-erase cycle counts may be maintained for all blocks of the memory array. An amplification ratio may be applied to the write-erase cycle count of a defective erase block to amplify the effect of write-erase cycles compared with the effect of write-erase cycles on write-erase cycle counts of non-defective erase blocks. Programming of the defective erase block may be performed using a modified set of programming parameters that is different to a set of programming parameters used to program erase blocks that are not defective. The data along the word lines of the defective erase block that are not the shorted word lines may subsequently be read using a modified set of read parameters that is different to a set of read parameters applied to erase blocks that are not defective. Data read from word lines of the defective erase block that are not the shorted word lines and are in close proximity to the shorted word lines may be monitored for significant errors. In response to identifying significant errors in data read from word lines of the defective erase block that are not the shorted word lines and are in close proximity to the shorted word lines, the defective erase block may be marked as unusable. The data along the word lines of the defective erase block that are not the shorted word lines may subsequently be erased using a modified set of erase parameters that is different to a set of erase parameters applied to erase blocks that are not defective. The memory array may be a Multi-Level Cell (MLC) array, and programming of the defective erase block may be performed using a modified page order that is different to a page order used to program erase blocks that are not defective. Additional defective erase blocks that contain broken word lines, or other defective components may be identified; location information regarding the location of the additional defective erase blocks may be recorded; and the additional defective erase blocks may be maintained in an unused condition throughout the non-volatile memory array's life cycle.

An example of a non-volatile memory system includes: an array of memory cells that are erasable in erase blocks; at least one defective erase block that has two or more word lines that are shorted together; location recording circuits that are configured to record the location of the erase block, and to record the location within the defective erase block of the word lines that are shorted together; and programming circuits that are configured to program data along word lines of the defective erase block that are not shorted together.

The programming circuits may be configured to program data only along word lines that are not shorted together and are more than a predetermined distance from the two or more word lines that are shorted together. The predetermined distance may be at least twice the pitch, leaving at least one dummy word line on each side of the two or more word lines that are shorted together. The programming circuits may be configured to maintain an elevated pass voltage to the two or more word lines that are shorted together during programming of data along word lines of the defective erase block that are not shorted together, the elevated pass voltage being higher than a pass voltage applied to unselected word lines of the defective erase block that are not shorted together. Reading circuits may be configured to maintain an elevated pass voltage to the two or more word lines that are shorted together during reading of data along word lines of the defective erase block that are not shorted together, the elevated pass voltage being higher than a pass voltage applied to unselected word lines of the defective erase block that are not shorted together. A write-erase cycle count circuit may maintain write-erase cycle counts for all erase blocks, the write-erase cycle count circuit configured to weight write-erase cycle counts so that the write-erase cycle count of the defective erase block increases more rapidly than write-erase cycle counts of non-defective erase blocks. Additional defective erase blocks may contain broken word lines, or other defective components, the location recording circuits configured to record the locations of the additional defective erase blocks as bad blocks that are not to be used.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 7 illustrates how programming of non-shorted word lines may be performed.

DETAILED DESCRIPTION

Memory System

Figure 1:
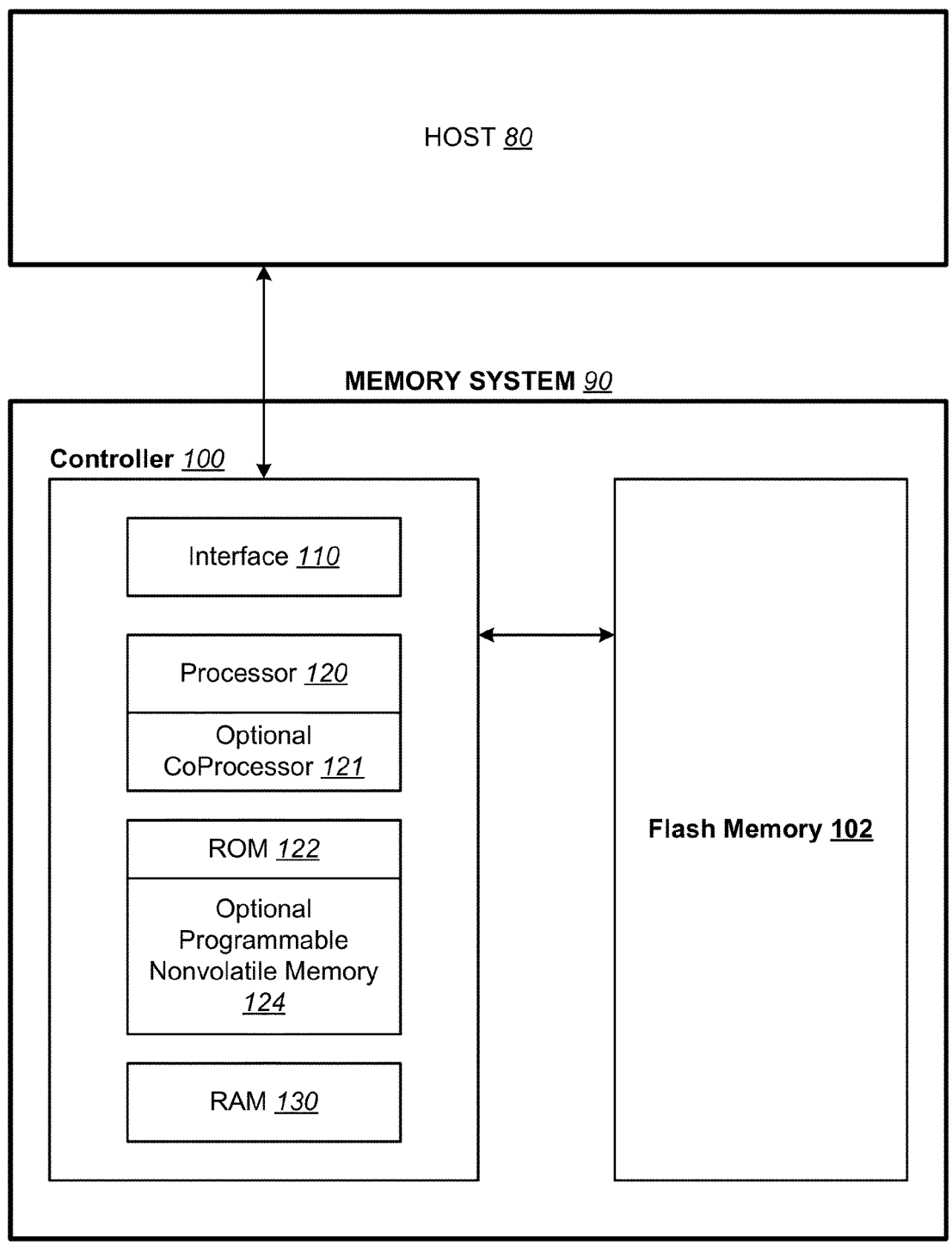
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 102. Firmware stored in nonvolatile ROM 122 and/or the optional nonvolatile memory 124 or Flash memory 102 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
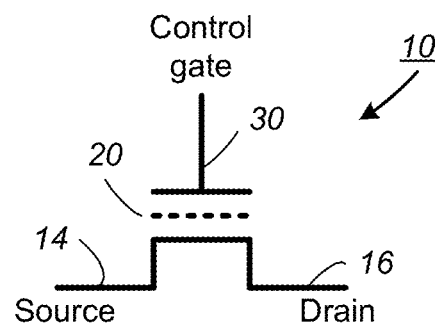
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

Figure 3:
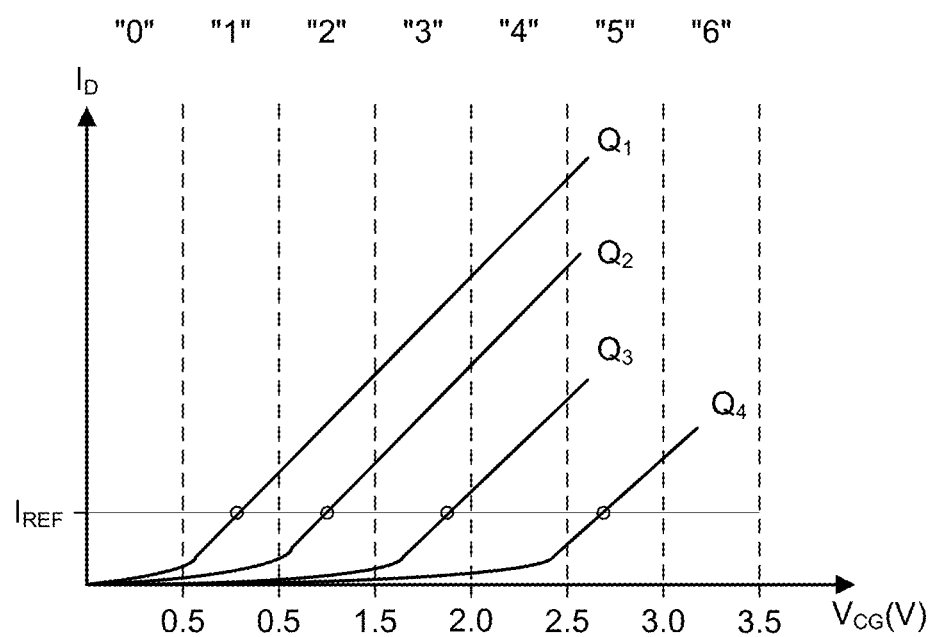
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven programmed memory states "0", "1", "2", "3", "4", "5", "6", and the erased state (VCG<0, not shown in FIG. 3) may be demarcated by partitioning the threshold window into eight regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
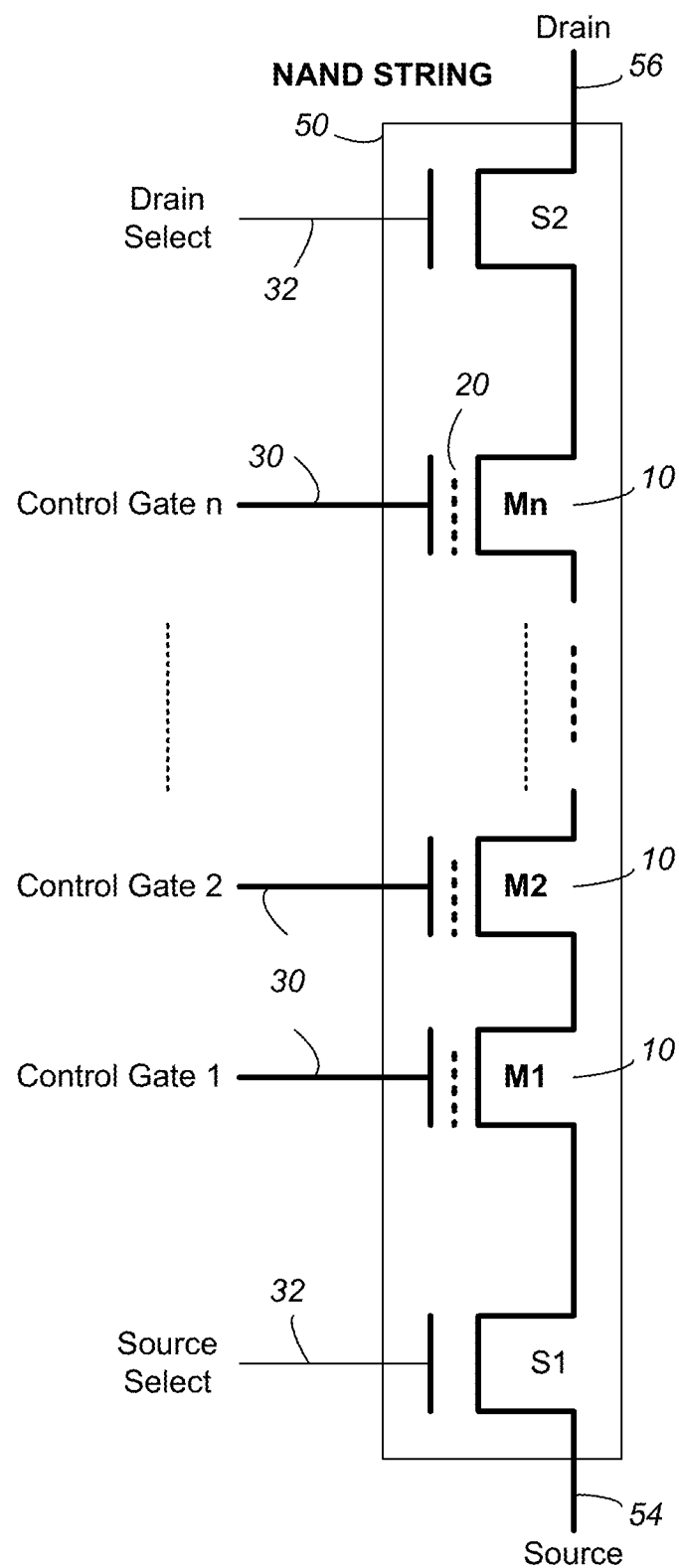
FIG. 4A illustrates schematically a string of memory cells organized into a NAND string.

FIG. 4A illustrates schematically a string of memory cells organized into a NAND string. A NAND string 50 comprises of a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

Figure 4B:
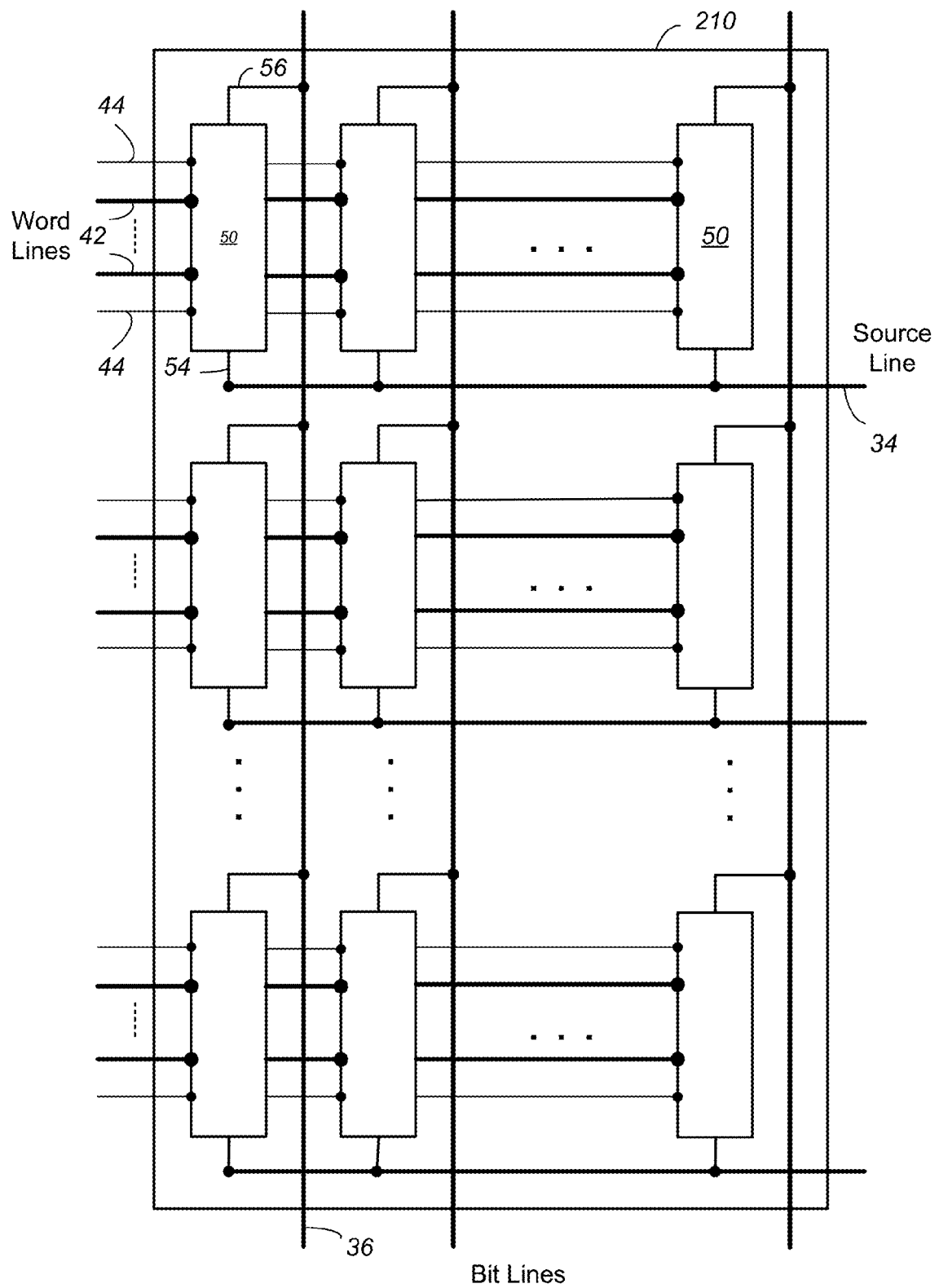
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. A bit line such as bit line 36 is coupled to the drain terminal 56 of NAND strings thus connecting NAND strings along the bit line direction. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
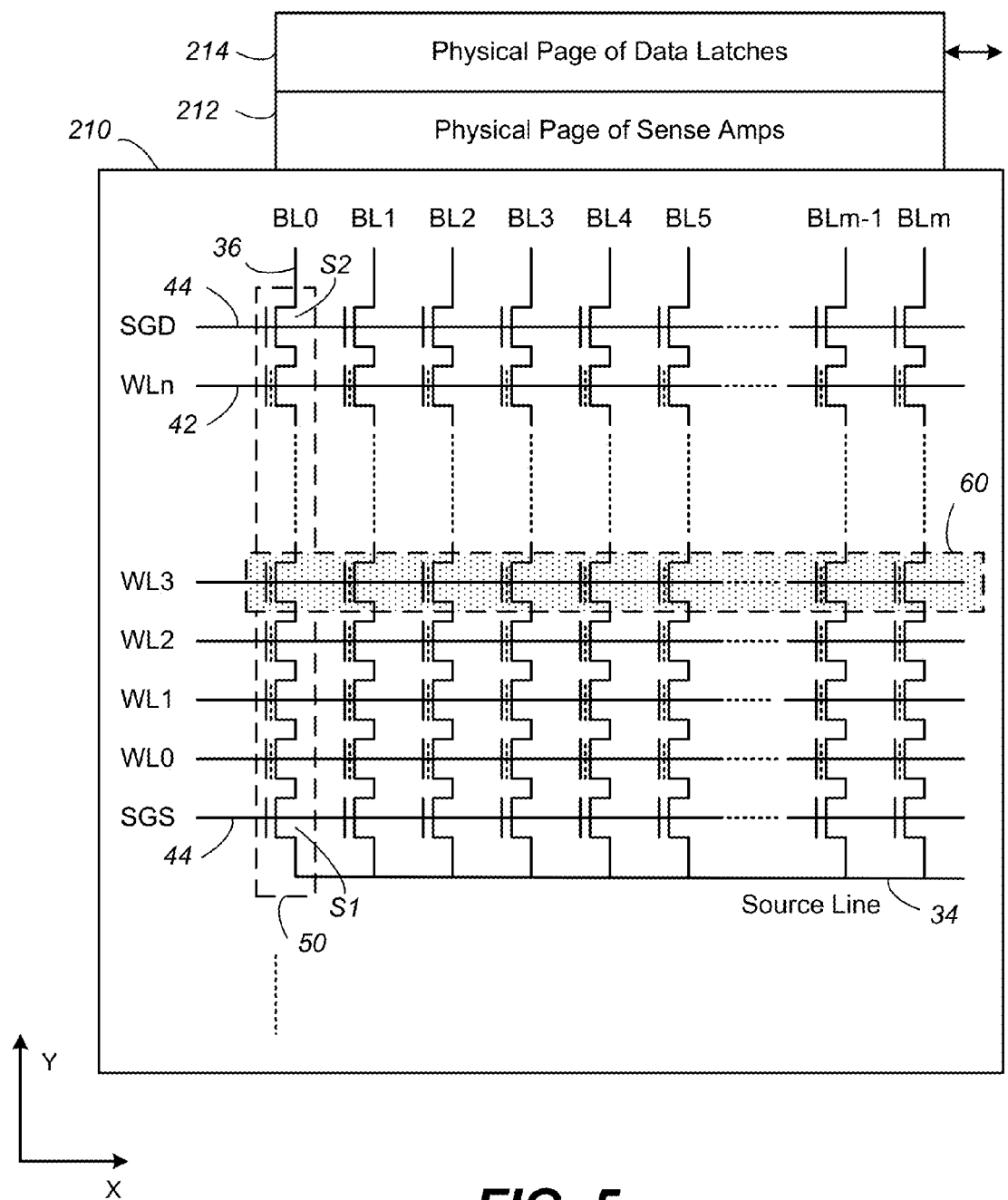
FIG. 5 illustrates a page of memory cells along a word line in a NAND flash memory being sensed or programmed in parallel.

FIG. 5 illustrates a page of memory cells, organized in the NAND configuration, being sensed or programmed in parallel. FIG. 5 essentially shows a block formed of NAND strings 50 in the memory array 210 of FIG. 4B, where the detail of each NAND string is shown explicitly as in FIG. 4A. A physical page, such as the page 60, is a group of memory cells along a word line (WL3) enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines. All other memory cells along the NAND string are turned on during reading and programming of a cell that is selected. This is achieved by providing appropriate biasing, e.g. a pass voltage (Vpass), to unselected word lines.

Memory dies contain many memory cells and usually contain a certain number of defects. Defects may be caused by physical flaws that occur during device formation, for example, as a result of contamination. Defects may be present from manufacture or may develop later. If the number of defective cells is not too high, the memory die can generally be configured to deal with such defects (e.g. using ECC), and may meet performance criteria and be sold for use. In some cases, blocks containing defects are marked as bad blocks and are not used. However, bad blocks reduce the capacity of the memory and thus reduce the value of the memory. If the number of bad blocks is too high, the memory may be considered to be defective and may be discarded. Because of the high cost of discarding such dies it is generally desirable to operate dies if possible rather than discarding dies. However, it is desirable to do so in an efficient manner so that space on the die is not consumed unnecessarily and performance is not significantly impacted.

In some cases, defects may affect one or more word lines. Such defects may have an impact on memory cells along the word line and, in addition, may have an impact on memory cells of other word lines. For example, FIG. 5 shows the series connection of memory cells along NAND strings in the y-direction. Such series connection means that a problem affecting a single memory cell along such a string may make the string unusable, thus affecting all memory cells along the string. For example, a defect that prevents correct biasing of WL3 may prevent memory cells along WL3 from being turned on when accessing memory cells along other word lines. Thus a NAND string 50 intersecting WL3 may remain non-conductive regardless of the applied voltages, thereby preventing programming or reading of data. A defective word line may be considered as fatal to a block, leading to the block being discarded, with the resulting reduction in capacity (and therefore value) of the memory.

Operating Blocks with Physical Defects

According to aspects of the present invention, certain word line defects may be managed to allow at least partial use of the block in which they are located. While not all defective blocks may be usable in this way, even a small increase in the number of usable blocks may provide a significant increase in the value of a memory.

Figure 6A:
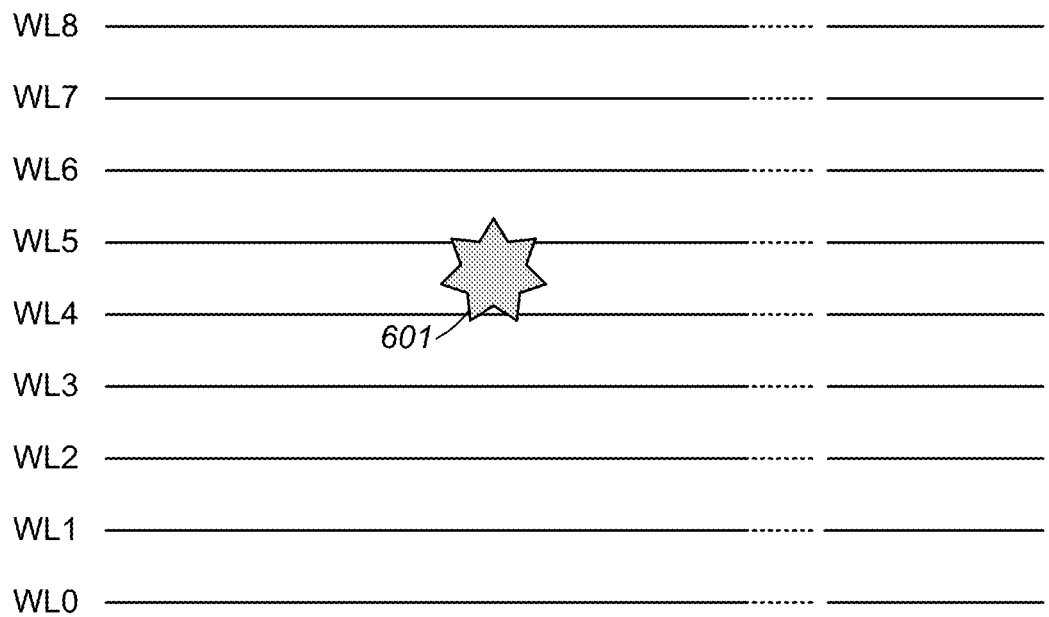
FIG. 6A shows an example of shorting of two word lines.

FIG. 6A shows a first type of word line defect where a portion of conductive material connects two word lines (WL4 and WL5), shorting them together, and preventing their normal operation. The conductive material electrically connects the two word lines with a low electrical resistance so that electrical current may flow between them. Three or more word lines may also be shorted together in this way.

Figure 6B:
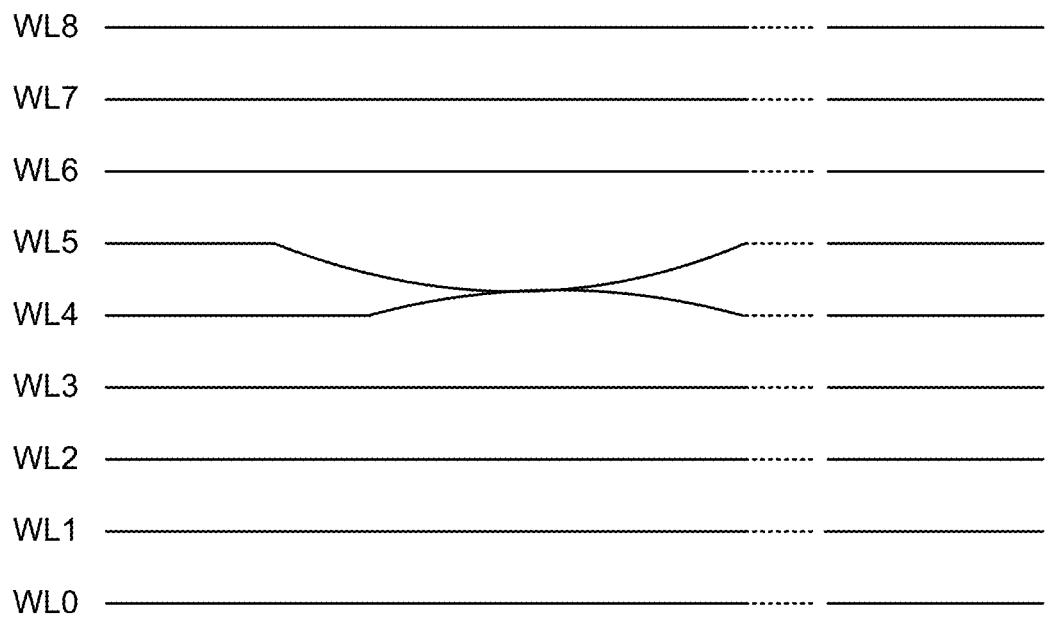
FIG. 6B shows another example of shorting of two word lines.

FIG. 6B shows another type of word line defect where two word lines (WL4 and WL5) are shorted together because word line collapse causes adjacent word lines to come in contact. This problem may be especially common in high aspect ratio structures that are subject to significant forces (e.g. during Chemical Mechanical Polishing).

In either of the two examples above, independent biasing of the affected word lines is no longer possible because the word lines are shorted together. The term "shorted together" generally means that the resistance between the word lines is significantly lower than between non-shorted word lines. While ideally the resistance between word lines would be infinite, real structures have some very high resistance (e.g. in the GigaOhm range) while the resistance between shorted word lines may be several orders of magnitude lower (e.g. in the MegaOhm range, or below). In general, a "good" value for resistance between word lines depends on the memory design (e.g. on pitch of memory array). A "bad" value for resistance between word lines (a value indicating shorted word lines) is a value that is significantly lower than a good value, for example, at least an order of magnitude lower, or even two, three, or more orders of magnitude lower.

In order to allow access to at least a portion of a defective block containing such shorted word lines, data may be programmed in a manner that is different to that used for non-defective blocks. For example, different data may be stored in defective blocks, different biasing schemes may be used, pages may be programmed in a different order, and certain word lines may be operated as dummy word lines that separate shorted word lines from non-shorted word lines.

FIG. 7 is a table showing an example of how a block may be operated where two word lines are shorted together. In this example, word lines 10 and 11 are shorted (by either some conductive material as shown in FIG. 6A, word line collapse as shown in FIG. 6B, or some other cause). Word lines are listed in the left column in the order in which they are programmed (WL0, WL1, WL2 . . . ). Non-defective block operation is illustrated in the middle columns, and defective block operation is illustrated in the right columns.

While WL10 and WL11 would normally store both upper and lower page data in this MLC example, here they are not used to store any data and are linked together so that row decoder circuits always provide the same bias voltage to both WL10 and WL11. Furthermore, WL9 and WL12, on either side of the shorted word lines are operated as dummy word lines. This means that they are not used to store any user data. They may be left unprogrammed, or may be programmed with some dummy data. Where dummy data is programmed, the dummy data may be roughly programmed, without verification, because the exact threshold voltages of such cells are generally not important.

In the example of FIG. 7, the same bias is applied to WL10 and WL11 during any access to the block. Rather than try to individually bias word lines as in non-defective blocks, the shorted word lines are biased together. Furthermore, because no data is stored along WL10 and WL11, these word lines are never selected, only unselected. While other unselected word lines may receive a pass voltage during read and write operations, WL10 and WL11 are biased to a higher pass voltage than other word lines. A pass voltage is generally a voltage that is sufficient to turn on (make conductive) any memory cell whether programmed or not. A higher pass voltage supplied to WL10 and WL11 gives a better probability that memory cells will turn on and thus allow operation of other memory cells. Dummy word lines on either side may also receive higher pass voltages. In particular, because shorted word lines and dummy word lines do not store data, there is no risk of disturbing stored data along these word lines when applying higher pass voltages. While this example refers to two word lines that are shorted together, three or more word lines that are shorted together may be operated in this way also.

FIG. 7 also shows an altered page order for programming pages of the defective block. The page order skips WL9-WL12 in this example. In other examples additional dummy word lines may be provided so that more word lines are skipped.

Figure 8:
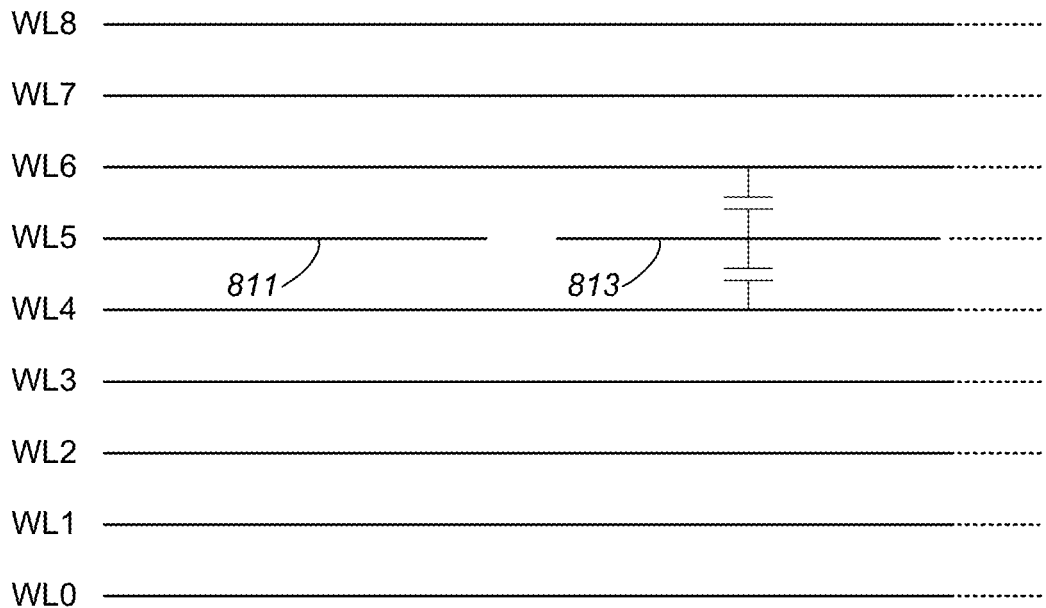
FIG. 8 shows an example of a broken word line.

FIG. 8 shows another type of defective block. In this case, a word line, WL5, is broken. There is a break in WL5 so that a first portion 811 of the word line is separated from a second portion 813. While the first portion 811 may be usable because it remains connected to word line driver circuits, the second portion 813 cannot be biased in the normal way, using the word line driver circuits. Such a block may have a large number of NAND strings that intersect the second portion 813 and are therefore not usable using conventional techniques.

According to an example, an isolated portion of a broken word line such as WL5 may be operated by appropriately biasing neighboring word lines. In particular, WL4 and WL6 are capacitively coupled to WL5 as shown. While the second portion 813 may be physically isolated from other components, it may still be possible to turn on memory cells along this second portion through WL4 and WL6. In this example, WL4 and WL6 may be configured as dummy word lines because the high voltages applied to them for coupling to WL5 may make them unsuitable for storage of data. Additional word lines on either side may also be configured as dummy word lines to provide isolation between WL4, WL6 and any word line where data is stored. For example, WL3 and WL7 may additionally be configured as dummy word lines. While a block such as shown in FIG. 8 would generally have been considered a bad block, and would have been discarded in the past, by applying appropriate biasing to neighboring word lines, memory cells along the broken word line can be turned on and the block can store data along at least some of the word lines (while 9 word lines are shown it will be understood that a block may contain many more such word lines).

Reducing Wear on Defective Blocks

Defective blocks may be more susceptible to failure during operation even when they are operated using the techniques described. They may tend to wear out more rapidly than non-defective blocks. So, in some cases, it may be desirable to reduce wear on such blocks.

In an example, write-erase cycle counts ("hot counts") are maintained for all blocks, with an amplification ratio applied to defective blocks so that their cycle counts are incremented more per cycle than other blocks. For example, cycle counts of non-defective blocks may be incremented by 1 for every cycle, while cycle counts of defective blocks may be incremented by 1.2 (amplification ratio of 1.2:1), or 2 (amplification ratio of 2:1), or some other number that is greater than 1. When such numbers are used by a wear-leveling algorithm that keeps cycle counts approximately the same across all blocks, the number of actual cycles on defective blocks is reduced compared with non-defective blocks, thus extending their expected life. An amplification ratio may be chosen based on experience with a particular type of defect in a particular design of memory. For example, if defective blocks with shorted word lines are found to wear out twice as fast as non-defective blocks, then using an amplification ratio of 2 should result in defective blocks experiencing half as many actual cycles as non-defective blocks so that they wear out at approximately the same time. Different defective blocks may be operated with different amplification ratios depending on the nature and number of defects they contain.

In addition to operating a defective block using different operating parameters, and with different cycle count increments, the data that is stored in such a defective block may be chosen for storage in a defective block based on the nature of the data and the expected frequency of accessing the data. For example, data that is not frequently accessed ("cold data") may be chosen for storage in a defective erase block so that the number of access operations is reduced. Similarly, data may be chosen so that the block is written at one time (e.g. when a stream of data that is large enough to fill the block is to be stored). Smaller writes may be sent to non-defective blocks while large sequential writes are sent to defective blocks. In this way, disturbance caused by multiple write operations may be reduced.

Identifying and Recording Defects

Figure 9:
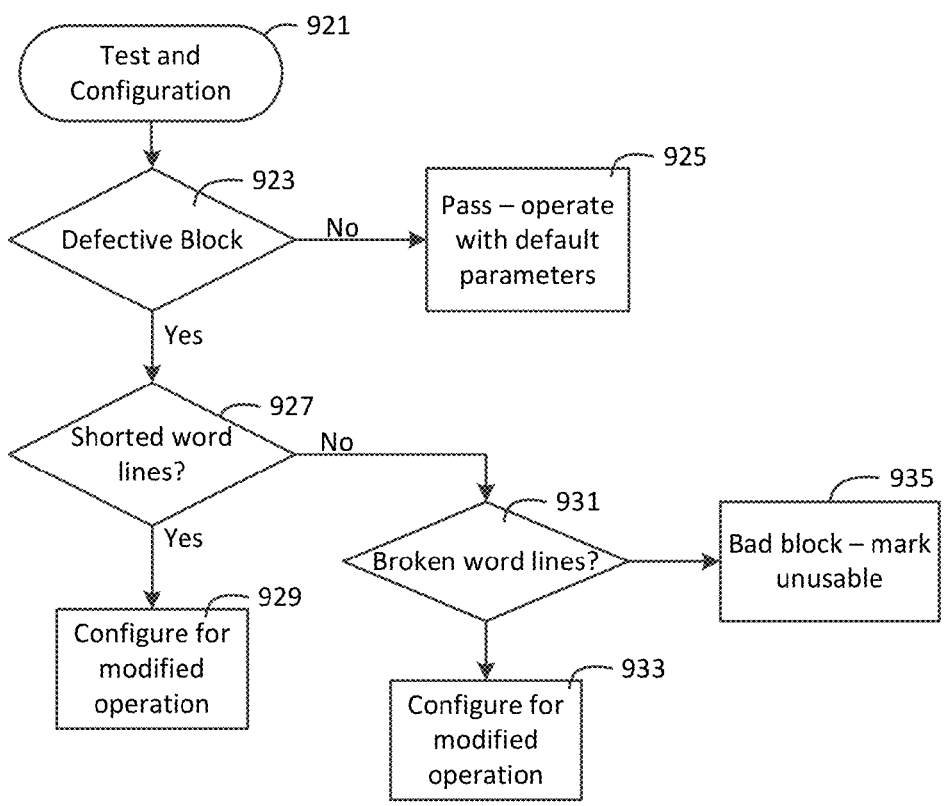
FIG. 9 illustrates a test and configuration scheme.

Defects may be identified and have their locations recorded during an initial testing operation (e.g. factory test) or later (e.g. after some use by an end-user). FIG. 9 shows an example of a testing and configuration operation 921 that is performed at a factory prior to a memory being shipped to an end-user. A determination is made 923 as to whether individual blocks are defective. If they are not defective, then they pass and are operated using default parameters 925. If a block is defective, rather than simply discarding the block, further testing is performed to determine if the failure mechanism is one that allows at least partial operation. If the defective block contains word lines that are shorted together 927 and can pass some testing (e.g. a high pass voltage applied to shorted word lines makes the underlying memory cells conductive) then the block is configured for modified operation 929 (e.g. common bias to shorted word lines; different programming, reading, and erasing parameters; neighboring word lines configured as dummy word lines; different cycle count scheme; and/or storing different data). If the defective block does not contain shorted word lines then a determination is made as to whether the defective block contains a broken word line 931. Some testing may be performed to determine if neighboring word lines can be used to control memory cells along the broken word line and if they can then the block is configured for modified operation 933 (e.g. high coupling voltages to neighboring word lines; dummy word lines on either side; different cycle count scheme; and/or storing different data). If the defective block does not contain word lines that are shorted together, or broken word lines, then the block may be marked as a bad block that is unusable 935. The block is then discarded, and is not used to store any data, thereby reducing the capacity of the memory.

In addition to initial testing, further testing may be performed on a memory whenever a bad block develops. For example, when the memory system fails to program, read, or erase memory cells along one or more word lines, the memory may perform testing to indicate whether the defect is one that would allow at least partial operation of the block. If so, then the block may be configured for modified operation. If not, then it is marked as a bad block that is not to be used.

Whenever defective blocks are detected, their locations are recorded so that the memory can manage data storage accordingly. For unusable defective blocks, this means that the memory discards the blocks and does not save any data in them. For usable defective blocks, the location of the defect (or locations of the defects) within the block may be recorded so that the memory system can operate accordingly. Thus, for example, the locations of the word lines that are shorted together in a block, or word lines that are broken, may be recorded along with the location of the block. This allows the memory to apply the appropriate modified voltages to the word lines of the block.

Figure 10:
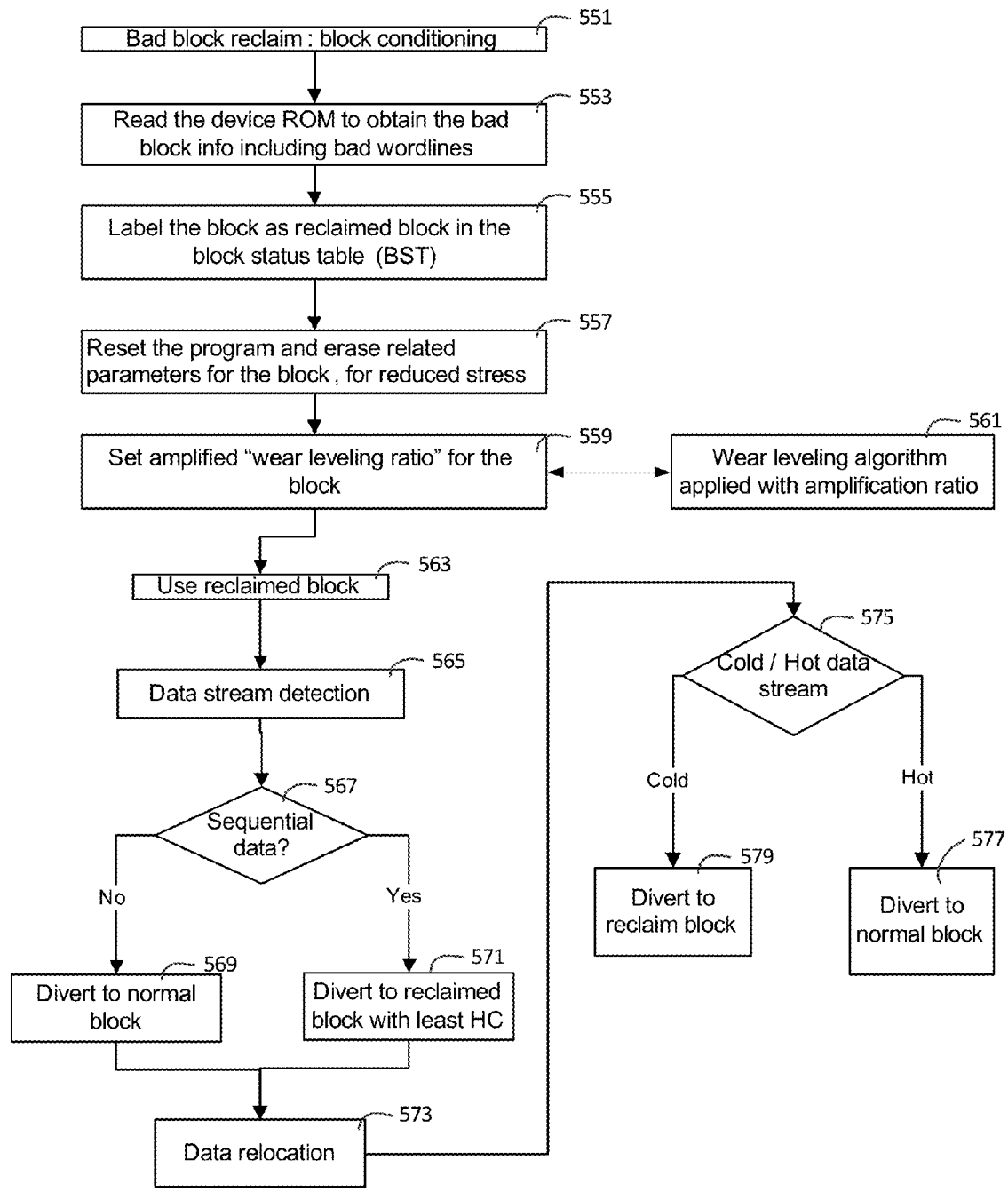
FIG. 10 illustrates how bad blocks may be reclaimed.

FIG. 10 illustrates an example of how bad blocks may be reclaimed 551. Bad blocks are identified by reading the device ROM 553, where locations of bad blocks and bad word lines are recorded. Where testing shows that a particular block is capable of at least partial operation the block is labeled as reclaimed 555. This means that it is available for storage of data. Various parameters are reset 557 for the block so that it is less stressed during operation. Additionally, an amplified wear leveling ratio is applied 559 to the block so that when a wear leveling algorithm is applied during operation 561, the defective block will be cycled fewer times than non-defective blocks. The block is then made available for use 563. A stream of data to be stored is detected 565 and a determination is made as to whether it is sequential data or not 567. If it is not sequential then it is stored in a non-defective block 569. If it is sequential data is stored in a reclaimed block with the lowest hot count 571. Subsequently, when data is to be relocated 573, a determination is made 575 as to whether the data is cold or hot depending on how often the data is accessed. Frequently accessed hot data is stored in non-defective blocks 577 while infrequently accessed cold data is stored in reclaimed defective blocks 579.

While the above examples refer to particular types of physical defects that occur in particular memory designs, it will be understood that aspects of the present invention may be applied to a wide range of defects and memory designs. Aspects of the above examples may be used separately or together in any combination. For example, modified pass voltages may be used with, or without, a modified cycle count scheme, and with, or without, selection of infrequently accessed and/or sequential data.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a block erasable non-volatile memory array that has one or more defective erase blocks, comprising:
   identifying two or more word lines that are shorted together in a defective erase block;
   recording location information regarding the location of the defective erase block and the location of the shorted word lines within the defective erase block; and
   subsequently, programming data along word lines of the defective erase block that are not the shorted word lines while the shorted word lines receive a pass voltage that is higher than a pass voltage applied to unselected word lines that are not shorted.

2. The method of claim 1 wherein at least one word line on either side of the shorted word lines is maintained as a dummy word line that does not store host data.

3. The method of claim 2 wherein the dummy word line is programmed with dummy data.

4. The method of claim 3 wherein the dummy data is programmed without verification.

5. The method of claim 1 wherein the data is selected for storage in the defective erase block because it is cold data that is not frequently modified or accessed.

6. The method of claim 1 wherein the data is selected for storage in the defective erase block because it is received as a stream of sequential data that is programmed at the same period of time.

7. The method of claim 1 wherein the electrical resistance between shorted word lines is small enough that a voltage applied to a first shorted word line affects a voltage on a second shorted word line.

8. The method of claim 1 further comprising maintaining write-erase cycle counts for all blocks of the memory array.

9. The method of claim 8 further comprising applying an amplification ratio to the write-erase cycle count of a defective erase block to amplify the effect of write-erase cycles compared with the effect of write-erase cycles on write-erase cycle counts of non-defective erase blocks.

10. The method of claim 1 wherein programming of the defective erase block is performed using a modified set of programming parameters that is different to a set of programming parameters used to program erase blocks that are not defective.

11. The method of claim 1 further comprising, subsequently reading the data along the word lines of the defective erase block that are not the shorted word lines, the reading performed using a modified set of read parameters that is different to a set of read parameters applied to erase blocks that are not defective.

12. The method of claim 11 further comprising monitoring data read from word lines of the defective erase block that are not the shorted word lines and are in close proximity to the shorted word lines for significant errors.

13. The method of claim 12 further comprising, in response to identifying significant errors in data read from word lines of the defective erase block that are not the shorted word lines and are in close proximity to the shorted word lines, marking the defective erase block as unusable.

14. The method of claim 1 further comprising, subsequently erasing the data along the word lines of the defective erase block that are not the shorted word lines, the erasing performed using a modified set of erase parameters that is different to a set of erase parameters applied to erase blocks that are not defective.

15. The method of claim 1 wherein the memory array is a Multi-Level Cell (MLC) array, and programming of the defective erase block is performed using a modified page order that is different to a page order used to program erase blocks that are not defective.

16. The method of claim 1 further comprising identifying additional defective erase blocks that contain broken word lines, or other defective components;
recording location information regarding the location of the additional defective erase blocks; and
maintaining the additional defective erase blocks in an unused condition throughout the non-volatile memory array's life cycle.

17. The method of claim wherein 1 wherein the shorted word lines are coupled to first memory cells and the word lines of the defective block that are not shorted are coupled other second memory cells that are connected in series with the first memory cells by NAND strings.

18. A non-volatile memory system comprising:
an array of memory cells that are erasable in erase blocks;
at least one defective erase block that has two or more word lines that are shorted together;
location recording circuits that are configured to record the location of the erase block, and to record the location within the defective erase block of the word lines that are shorted together; and
programming circuits that are configured to program data along word lines of the defective erase block that are not shorted together and are configured to maintain an elevated pass voltage to the two or more word lines that are shorted together during programming of data along word lines of the defective erase block that are not shorted together, the elevated pass voltage being higher than a pass voltage applied to unselected word lines of the defective erase block that are not shorted together.

19. The non-volatile memory system of claim 18 wherein the programming circuits are configured to program data only along word lines that are not shorted together and are more than a predetermined distance from the two or more word lines that are shorted together.

20. The non-volatile memory system of claim 18 wherein the predetermined distance is at least twice the pitch, leaving at least one dummy word line on each side of the two or more word lines that are shorted together.

21. The non-volatile memory system of claim 18 further comprising reading circuits that are configured to maintain an elevated pass voltage to the two or more word lines that are shorted together during reading of data along word lines of the defective erase block that are not shorted together, the elevated pass voltage being higher than a pass voltage applied to unselected word lines of the defective erase block that are not shorted together.

22. The non-volatile memory system of claim 18 further comprising a write-erase cycle count circuit that maintains write-erase cycle counts for all erase blocks, the write-erase cycle count circuit configured to weight write-erase cycle counts so that the write-erase cycle count of the defective erase block increases more rapidly than write-erase cycle counts of non-defective erase blocks.

23. The non-volatile memory system of claim 18 further comprising additional defective erase blocks that contain broken word lines, or other defective components, the location recording circuits configured to record the locations of the additional defective erase blocks as bad blocks that are not to be used.

24. The non-volatile memory system of claim 18 wherein the memory cells of the defective block are connected in series in NAND strings.

* * * * *